(12) United States Patent
Nakamura et al.

(10) Patent No.: US 9,476,912 B2
(45) Date of Patent: Oct. 25, 2016

(54) KELVIN CONTACT PROBE STRUCTURE AND A KELVIN INSPECTION FIXTURE PROVIDED WITH THE SAME

(75) Inventors: Shinichi Nakamura, Tokyo (JP); Fumiaki Nanami, Tokyo (JP)

(73) Assignee: UNITECHNO, INC., Tokyo (JP)

( * ) Notice: Subject to any disclaimer, the term of this patent is extended or adjusted under 35 U.S.C. 154(b) by 179 days.

(21) Appl. No.: 14/395,343

(22) PCT Filed: Apr. 17, 2012

(86) PCT No.: PCT/JP2012/002639
§ 371 (c)(1),
(2), (4) Date: Oct. 17, 2014

(87) PCT Pub. No.: WO2013/157033
PCT Pub. Date: Oct. 24, 2013

(65) Prior Publication Data
US 2015/0160265 A1 Jun. 11, 2015

(51) Int. Cl.
*G01R 1/073* (2006.01)
*G01R 1/067* (2006.01)
*G01R 31/28* (2006.01)

(52) U.S. Cl.
CPC ........... *G01R 1/073* (2013.01); *G01R 1/06722* (2013.01); *G01R 31/2884* (2013.01); *G01R 31/2886* (2013.01); *G01R 1/06738* (2013.01)

(58) Field of Classification Search
CPC .............. G01R 1/0433; G01R 1/0466; G01R 1/07314; G01R 27/14
USPC ........................................ 324/754.05, 754.03
See application file for complete search history.

(56) References Cited

U.S. PATENT DOCUMENTS 7,298,153 B2 * 11/2007 Farris ................. G01R 1/06794
324/754.05
7,677,901 B1 * 3/2010 Suzuki ................. G01R 1/0466
439/66

(Continued)

FOREIGN PATENT DOCUMENTS

JP        07-023284 U      4/1995
JP        2002-350487 A    12/2002

(Continued)

OTHER PUBLICATIONS

International Search Report issued in International Application No. PCT/JP2012/002639 dated Jul. 24, 2012.

*Primary Examiner* — Tung X Nguyen
*Assistant Examiner* — Dominic Hawkins
(74) *Attorney, Agent, or Firm* — Venable LLP; Henry J. Daley

(57) ABSTRACT

A Kelvin inspection fixture is provided with contact probes, wherein the contact probe comprises an electrode side contact terminal in contact with a solder ball, and a land side contact terminal in contact with a land, and the contact probe comprises an electrode side contact terminal in contact with the solder ball, and a land side contact terminal in contact with a land. The contact probes are disposed so that an electrode side inclined face and an electrode side inclined face are held in an opposite relationship with respect to each other and so that a land side inclined face and a land side inclined face are held in a face to face relationship with respect to each other.

5 Claims, 10 Drawing Sheets

(56) References Cited

U.S. PATENT DOCUMENTS

| | | | |
|---|---|---|---|
| 2004/0013396 A1* | 1/2004 | Saulnier | G01R 1/06722 385/147 |
| 2006/0267601 A1* | 11/2006 | Farris | G01R 1/06794 324/754.05 |
| 2006/0279301 A1* | 12/2006 | Treibergs | G01R 1/0466 324/754.05 |
| 2010/0264935 A1* | 10/2010 | Erdman | G01R 1/0466 324/537 |
| 2013/0257467 A1* | 10/2013 | Tomioka | G01R 1/0466 324/750.25 |

FOREIGN PATENT DOCUMENTS

| | | |
|---|---|---|
| JP | 2003-167001 A | 6/2003 |
| JP | 2004-212233 A | 7/2004 |
| JP | 2004-279133 A | 10/2004 |
| JP | 2008-045986 A | 2/2008 |
| JP | 2008-096368 A | 4/2008 |

* cited by examiner

A ARROW VIEW          B ARROW VIEW

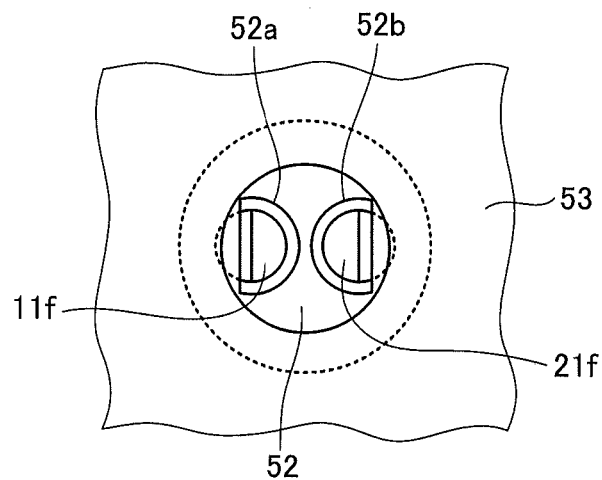
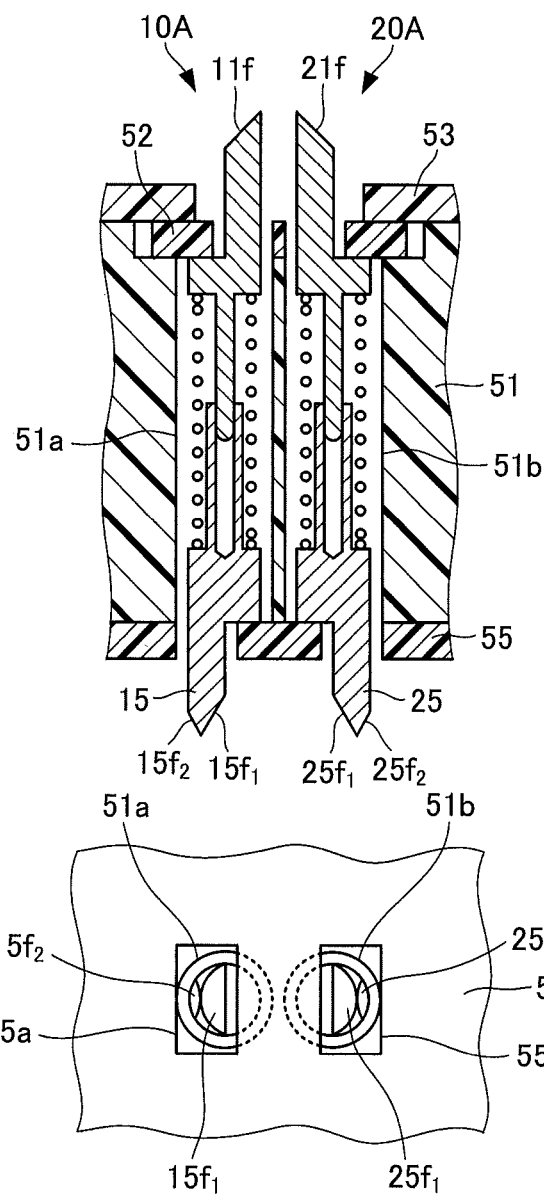
FIG.6A
FIG.6B
FIG.6C

KELVIN CONTACT PROBE STRUCTURE AND A KELVIN INSPECTION FIXTURE PROVIDED WITH THE SAME

TECHNICAL FIELD

The present invention relates to a Kelvin contact probe structure equipped with at least two contact probes, and, more particularly, to a Kelvin contact probe to be used during the inspection of a semiconductor integrated circuit, and a Kelvin inspection fixture equipped with the Kelvin contact probe structure.

BACKGROUND ART

Conventionally, as a method for the measurement of a two-terminal circuit is known a Kelvin connection measurement method (four-terminal resistance measurement method) is known. In the measurement method by Kelvin connection, each terminal of the two-terminal circuit is connected with probes respectively constituting parts of an electric current supply circuit and a voltage measurement circuit, thereby making it possible to inspect the two-terminal circuit without being affected by any circuit resistance of the electric current supply circuit and the voltage measurement circuit, as well as any contact resistance between the probes and the terminals.

As one of Kelvin inspection fixtures to be operated through the measurement method by Kelvin connection to inspect semiconductor integrated circuits and semiconductor devices (hereinafter simply referred to as "IC and others"), there have been proposed such as, for example, those disclosed in Patent Document 1. The Kelvin inspection fixture thus disclosed has two contact probes which are arranged in parallel with each other. Each of the contact probes includes an electrode side top end portion contactable with one of solder ball electrodes each forming part of the IC, and a land side top end portion contactable with one of lands respectively formed on a circuit substrate to be connected with an inspection circuit. Each of the electrode side top end portions has two inclined surfaces inclined in different angles with respect to the axial direction of the contact probe, and ridge lines formed with the two inclined surfaces and arranged to face each other.

The conventional Kelvin inspection fixture as disclosed in the above is configured to have the ridge lines of the electrode side top end portions wedged into the solder ball electrode while being securely engaged with the solder ball electrode, thereby causing oxides on the surface of the solder ball electrode to be broken, and thereby ensuring that the contact robe can electrically be connected with the solder ball electrode.

CITATION LIST

Patent Literature

Patent Document 1: Japanese Patent Publication No. 2008-96368

SUMMARY OF INVENTION

Technical Problem

In the IC and others, the solder ball electrodes or planar electrodes have recently been reduced in pitch in response to the miniaturization of integrated circuits, thereby achieving the minimization in size of the electrode itself. Under these circumstances, the Kelvin inspection fixture encounters such a problem as below.

(1) The conventional Kelvin inspection fixture is constituted by electrode side top end portions respectively having ridge lines arranged in face-to-face relationship with each other, so that the Kelvin inspection fixture can respond to the reduced pitch to a certain degree for the electrode of the IC and others in the form of a solder ball, but is difficult to respond the reduced pitch for the electrode of the IC and others in the form of a planar shape.

(2) The conventional Kelvin inspection fixture is constituted with land side top end portions having a pitch which is automatically determined by the pitch of the two contact probes, and therefore encounters such a problem that there is a case in which the lands of the circuit substrate and the wiring patterns become reduced in pitch in order to meet the need of the reduced pitch of the electrodes, thereby making it impossible to produce the inspection fixture, or otherwise there is a case in which the production cost of the circuit substrate is increased even if the inspection fixture can be produced.

The present invention has been made in order to solve the problems of the prior art, and has therefore an object to provide a Kelvin contact probe structure and a Kelvin inspection fixture provided with the Kelvin contact probe structure which can cope with narrow pitches of the electrode regardless of the shape of electrode to be inspected, and, moreover, can avoid an increase in manufacturing cost of the circuit substrate.

Solution to Problem

The Kelvin contact probe structure according to the present invention comprises: two contact probes including one contact probe and the other contact probe, and axially arranged in parallel with each other to have one electrode electrically connected with two lands, and the electrode being provided on an inspection object to be inspected, and the two lands being provided on a circuit substrate, which is so constructed that each of the one contact probe and the other contact probe has an electrode side contact terminal and a land side contact terminal provided therein, the electrode side contact terminal arranged in an electrode side to be contactable with the electrode, the land side contact terminal being arranged in a land side to be contactable with the land, each of the one contact probe and the other contact probe includes the electrode side contact terminal contactable with the electrode, the land side contact terminal contactable with the land and a metal spring arranged between the electrode side contact terminal and the land side contact terminal, the electrode side contact terminal includes a disk shaped electrode side contact terminal flange portion, an electrode side contact terminal rotation preventing portion, an electrode side inclined surface portion and a cylindrical rod, the disk shaped electrode side contact terminal flange portion having an electrode side surface and a land side surface, the electrode side contact terminal rotation preventing portion stretching from the electrode side surface of the electrode side contact terminal flange portion to be defined by a plate shaped electrode side contact terminal rotation preventing surface and a semi arc shaped electrode side contact terminal semi arc surface, the electrode side inclined surface portion defined by a surface inclined from center of a top end of the electrode side contact terminal semi arc surface toward the electrode side contact terminal flange portion, the cylindrical rod stretching from center of the land side surface of the electrode side contact terminal flange portion and being smaller in diameter than the electrode side contact terminal flange portion, the land side contact terminal includes a disk shaped land side contact terminal flange portion, a land side contact terminal rotation preventing portion, a land side inclined surface portion and a cylindrical hollow rod, the disk shaped land side contact terminal flange portion having a land side surface and an electrode side surface, the land side contact terminal rotation preventing portion stretching from the land side surface of the land side contact terminal flange portion to be defined by a plate shaped land side contact terminal rotation preventing surface and a semi arc shaped land side contact terminal semi arc surface, the land side inclined surface portion defined by a surface inclined from center of a top end of the land side contact terminal semi arc surface toward the land side contact terminal flange portion, the cylindrical hollow rod stretching from center of the electrode side surface of the land side contact terminal flange portion and being smaller in diameter than the land side contact terminal flange portion to receive the cylindrical rod, the metal spring being arranged between the land side surface of the electrode side contact terminal flange portion and the electrode side surface of the land side contact terminal flange portion, and the one contact probe and the other contact probe being arranged in such a manner that the electrode side inclined surfaces faces are held in an opposite relationship with respect to each other and that the land side inclined surfaces are held in a face to face relationship with respect to each other.

By the construction as set forth above, the Kelvin contact probe structure according to the present invention is so constructed that the one contact probe and the other contact probe are arranged in such a manner that each of the electrode side inclined surfaces are held in the opposite relationship with respect to each other and that each of the land side inclines surfaces are held in the face to face relationship with each other, thereby making it possible to cope with narrow pitches of the electrode regardless of the shape of electrode of the inspection object to be inspected, and, moreover, to avoid an increase in manufacturing cost of the circuit substrate.

Further, the Kelvin contact probe structure according to the present invention is so constructed that each of the electrode side contact terminals has a plurality of apices formed by at least one groove arranged at a top portion of the electrode side inclined surface.

By the construction as set forth above, the Kelvin contact probe structure according to the present invention can bring a plurality of apices into contact with the electrode of the inspection object to be inspected, thereby making it possible to obtain a more stable contact state.

The Kelvin inspection fixture according to the present invention comprises the Kelvin contact probe structure which comprises a housing body provided therein with a through bore and adapted to retain the one contact probe and the other contact probe through the through bore; an electrode side retention body that retains the electrode side contact terminal; and a land side retention body that retains the land side contact terminal.

By the construction as set forth above, the Kelvin contact probe structure according to the present invention can cope with narrow pitches of the electrode regardless of the shape of electrode of the inspection object to be inspected, and, moreover, can avoid an increase in manufacturing cost of the circuit substrate.

The Kelvin inspection fixture according to the present invention may preferably be so constructed to be provided with a connection portion arranged between the one contact probe and the other contact probe and adapted to connect the electrode side retention body and the land side retention body.

The Kelvin inspection fixture according to the present invention may preferably be so constructed to be provided with a cover member that covers an outer periphery of the one contact probe and the other contact probe.

Advantageous Effect of Invention

The present invention can provide a Kelvin contact probe structure and a Kelvin inspection fixture provided with the Kelvin contact probe structure which can cope with narrow pitches of the electrode regardless of the shape of electrode of the inspection object to be inspected, and, moreover, can avoid an increase in manufacturing cost of the circuit substrate.

BRIEF DESCRIPTION OF DRAWINGS

FIGS. 6A, 6B and 6C are construction views respectively similar to FIGS. 3A, 3B and 3C but showing the peripheral portion of another embodiment 2 of the contact probe forming part of the Kevin inspection fixture according to the present invention.

DESCRIPTION OF EMBODIMENTS

Hereinafter, embodiments of the present invention will be explained with reference to drawings.

First Embodiment

Figure 1:
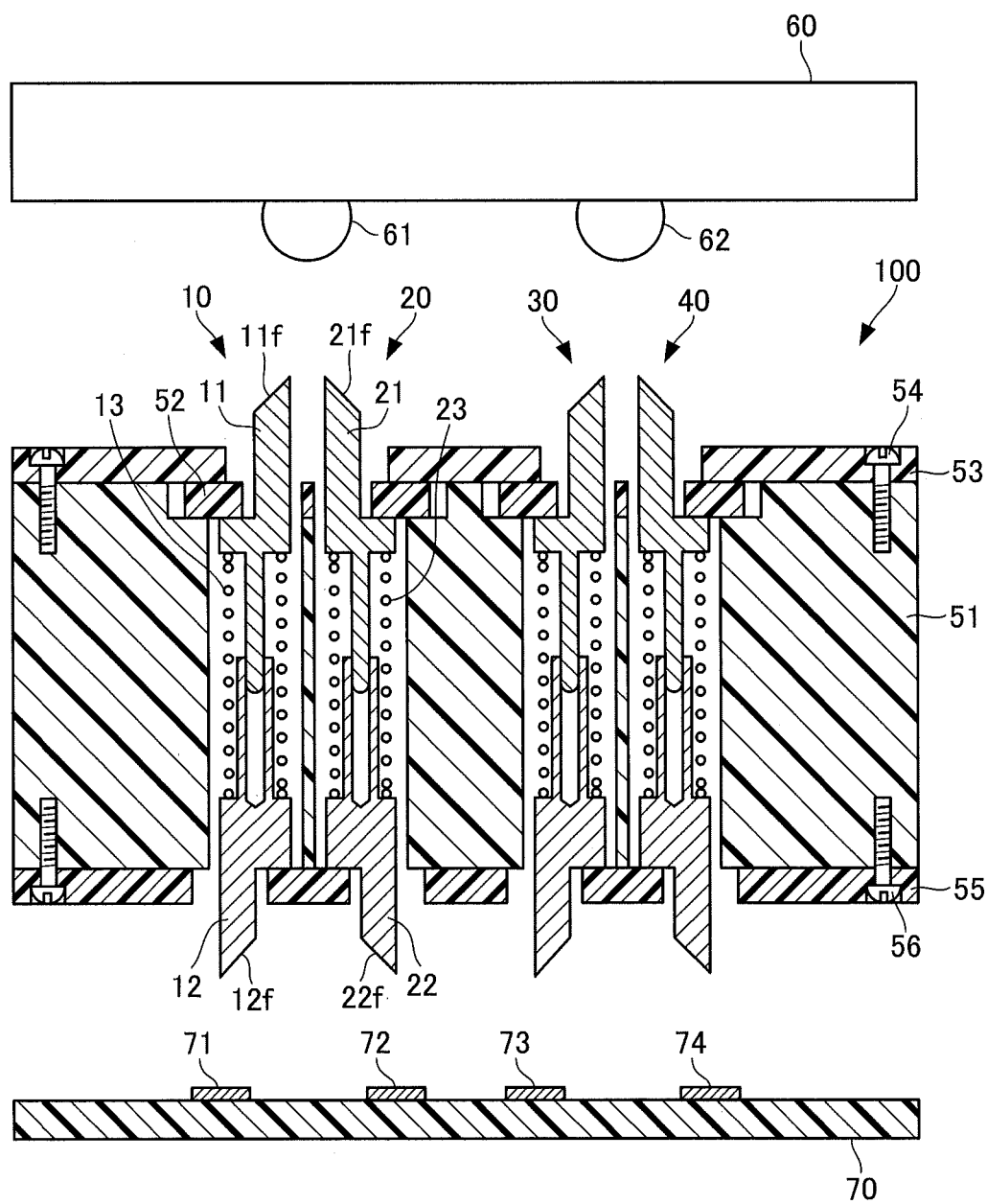
FIG. 1 is a cross-sectional view showing the construction of a first embodiment of a Kevin inspection fixture according to the present invention.

As shown in FIG. 1, a Kelvin inspection fixture 100 according to the present embodiment is adapted to inspect a resistance between a solder ball 61 and a solder ball 62 respectively arranged on a lower surface of an IC 60 by a Kelvin connection, the IC 60 being an integrated circuit of BGA (Ball Grid Array) type as an inspection object to be inspected. In a lower surface side of the Kelvin inspection fixture 100 is provided a circuit substrate 70 to which wirings (not shown) are connected from a current supply circuit or a voltage measurement circuit. The circuit substrate 70 has lands 71-74 provided on an upper surface thereof.

The Kelvin inspection fixture 100 has arranged therein with contact probes 10, 20, 30 and 40, a housing body 51, an electrode side retention body 52, a pressing plate 53, a screw 54, a land side retention body 55 and a screw 56.

The Kelvin inspection fixture 100 is so constructed that the contact probes 10 and 20 are brought into contact with the solder ball 61 while the contact probes 30 and 40 are brought into contact with the solder ball 62. As shown in drawings, although each of the contact probes 20, 30 and 40 has the same elements as those of the contact probe 10, each of the contact probes 20, 30 and 40 is assigned numerals different from those of the contact probe 10, for convenience of explanation. A set of contact probes 10 and 20 and a set of contact probes 30 and 40 respectively constitute a Kelvin contact probe structure according to the present invention.

The contact probe 10 has provided therein with a metal electrode side contact terminal 11 contactable with the solder ball 61, a metal land side contact terminal 12 contactable with the land 71 and a metal spring 13 arranged between the electrode side contact terminal 11 and the land side contact terminal 12.

Similarly, the contact probe 20 has provided therein with a metal electrode side contact terminal 21 contactable with the solder ball 61, a metal land side contact terminal 22 contactable with the land 72 and a metal spring 23 arranged between the electrode side contact terminal 21 and the land side contact terminal 22.

Figure 2:
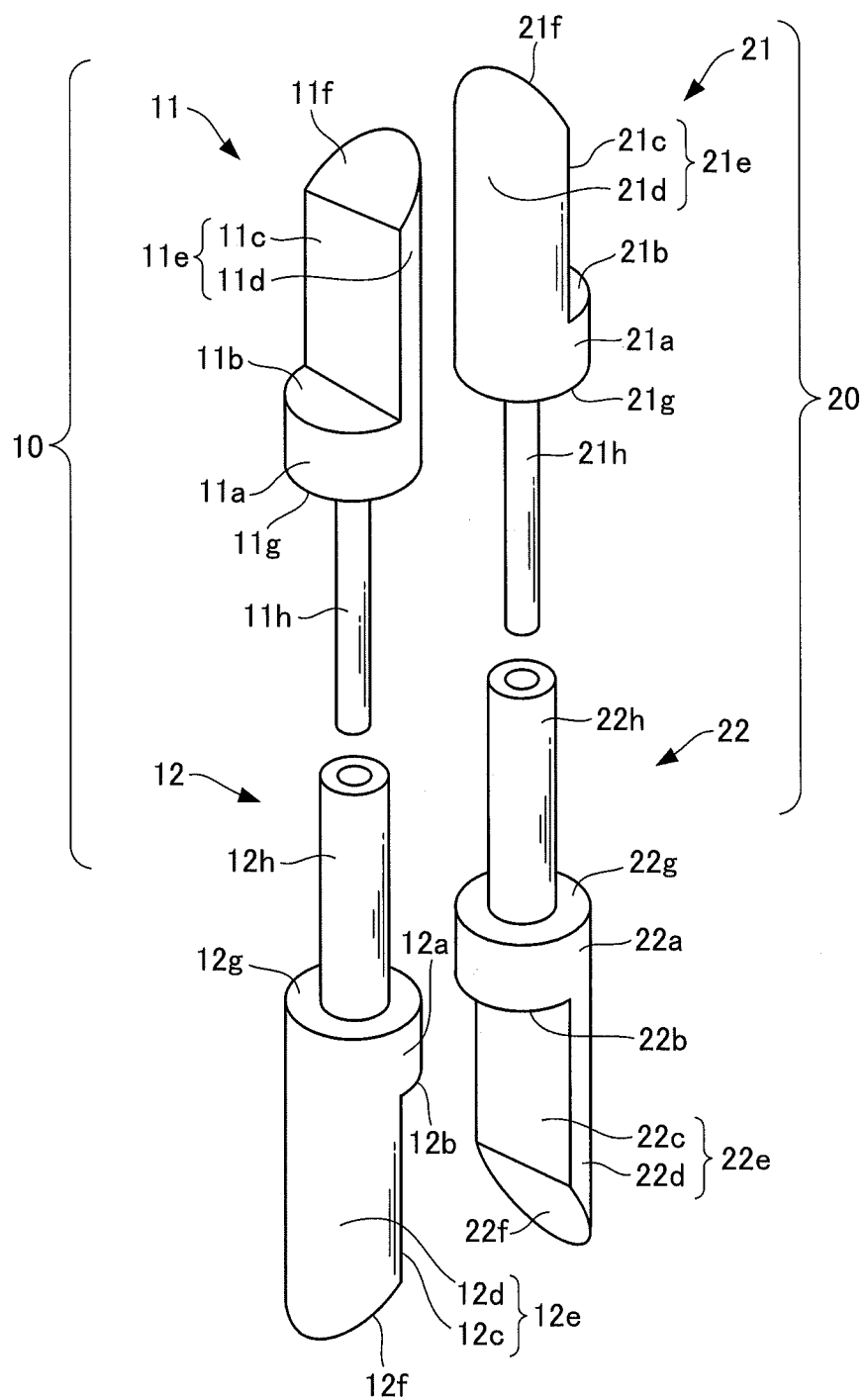
FIG. 2 is a perspective view showing a contact probe forming part of the first embodiment of the Kevin inspection fixture according to the present invention.

Next, the construction of the contact probes 10 and 20 is explained in detail with reference mainly to FIG. 2 and appropriately to FIG. 1. In FIG. 2, the spring 13 and the spring 23 are omitted for convenience of explanation.

As shown in FIG. 2, the electrode side contact terminal 11 of the contact probe 10 includes a disk shaped electrode side contact terminal flange portion 11a, an electrode side contact terminal rotation preventing portion 11e, an electrode side inclined surface portion 11f and a cylindrical rod 11h, the disk shaped electrode side contact terminal flange portion 11a has an electrode side surface 11b and a land side surface 11g, the electrode side contact terminal rotation preventing portion 11e stretching from the electrode side surface 11b of the electrode side contact terminal flange portion 11a to be defined by a plate shaped electrode side contact terminal rotation preventing surface 11c and a semi arc shaped electrode side contact terminal semi arc surface 11d, the electrode side inclined surface portion 11f defined by a surface inclined from center of a top end of the electrode side contact terminal semi arc surface 11d toward the electrode side contact terminal flange portion 11a, the cylindrical rod 11h stretching from center of the land side surface 11g of the electrode side contact terminal flange portion 11a and being smaller in diameter than the electrode side contact terminal flange portion 11a.

On the other hand, the land side contact terminal 12 of the contact probe 10 includes a disk shaped land side contact terminal flange portion 12a, a land side contact terminal rotation preventing portion 12e, a land side inclined surface portion 12f and a cylindrical hollow rod 12h, the disk shaped land side contact terminal flange portion 12a has a land side surface 12b and an electrode side surface 12g, the land side contact terminal rotation preventing portion 22e stretching from the land side surface 22b of the land side contact terminal flange portion 22a to be defined by a plate shaped land side contact terminal rotation preventing surface 12c and a semi arc shaped land side contact terminal semi arc surface 12d, the land side inclined surface portion 11f defined by a surface inclined from center of a top end of the land side contact terminal semi arc surface 12d toward the land side contact terminal flange portion 12a, the cylindrical hollow rod 12h stretching from center of the electrode side surface 12g of the land side contact terminal flange portion 12a and being smaller in diameter than the land side contact terminal flange portion 12a to receive the cylindrical rod 11h.

In the present embodiment, the electrode side contact terminals 11 and 21, the land side contact terminals 12 and 22 are formed by processing a metal cylindrical body, however, the electrode side contact terminals 11 and 21, the land side contact terminals 12 and 22 may also be formed by processing a triangular prism body or a polygonal prism body.

The electrode side inclined surface 11f is defined by a surface inclined from center of a top end of the electrode side contact terminal semi arc surface 11d toward the electrode side contact terminal flange portion 11a, while the land side inclined surface 12f is defined by surface inclined from center of a top end of the land side contact terminal semi arc surface 12d toward the land side contact terminal flange portion 12a. In the present embodiment, each of the inclined surfaces forms an angle of approximately 45 degrees with respect to a center axis of the contact probe 10. However, the angle is not limited to the above mentioned specific angle. Further, the electrode side inclined surface 11f and the land side inclined surface 12f are preferably arranged to be parallel with respect to each other.

The electrode side surface 11b of the electrode side contact terminal flange portion 11a and the land side surface 12b of the land side contact terminal flange portion 12a are adapted to be pushed against a lower surface of the electrode side retention body 52 and an upper surface of the land side retention body 55 by a repulsion of the spring 13, respectively.

The cylindrical rod 11h is received in a bore formed in the cylindrical hollow rod 12h, and the spring 13 is arranged in a periphery of the cylindrical rod 11h and the cylindrical hollow rod 12h. The electrode side contact terminal 11 and the land side contact terminal 12 are electrically connected with each other by at least either one of the cylindrical rod 11h and the cylindrical hollow rod 12h or the spring 13.

Here, the construction of the contact probe 20 is the same as the construction of the aforementioned contact probe 10. Therefore, the explanation of the contact probe 20 will be omitted by having the first digit "1" of the reference numerals replaced by another digit "2" and using the same digits for the second and the third digits in the reference numerals in the drawings.

As shown in FIG. 1 and FIG. 2, the contact probe 10 and the contact probe 20 are arranged in such a manner that the electrode side inclined surfaces 11f and the land side inclined surfaces 21f are held in an opposite relationship with respect to each other and that the land side inclined surface 12*f* and the land side inclined surface 22*f* are held in a face to face relationship with respect to each other.

By the construction as described above, an apex portion of the electrode side inclined surface 11*f* and an apex portion of the electrode side inclined surface 21*f* are approached with respect to each other to be brought into contact with the solder ball 61. An interval between the apices can be set to approximately 0.08 mm.

Further, by the construction as set forth above, an apex portion of the land side inclined surface 12*f* and an apex portion of the land side inclined surface 22*f* are spaced apart from each other to be brought into contact with the land 71 and the land 72, respectively. An interval between the apices can be set to approximately 0.6 mm.

Next, a peripheral construction of the contact probe 10 and the contact probe 20 will be explained with reference mainly to FIG. 3 and appropriately to FIGS. 1 and 2.

Figure 3A:
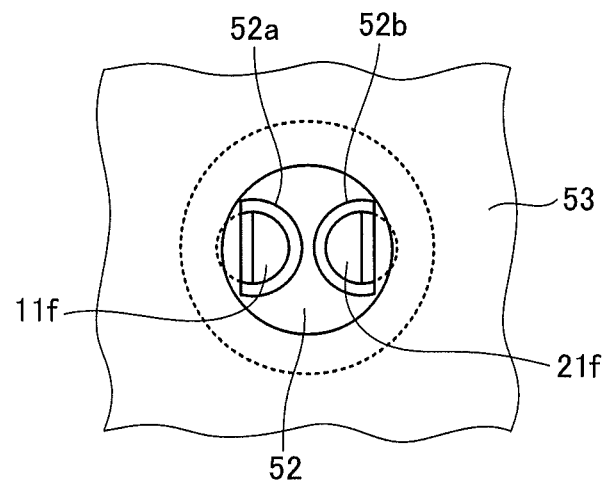
FIGS. 3A, 3B and 3C are construction views showing the peripheral portion of the contact probe forming part of the first embodiment of the Kevin inspection fixture according to the present invention.
Figure 3B:
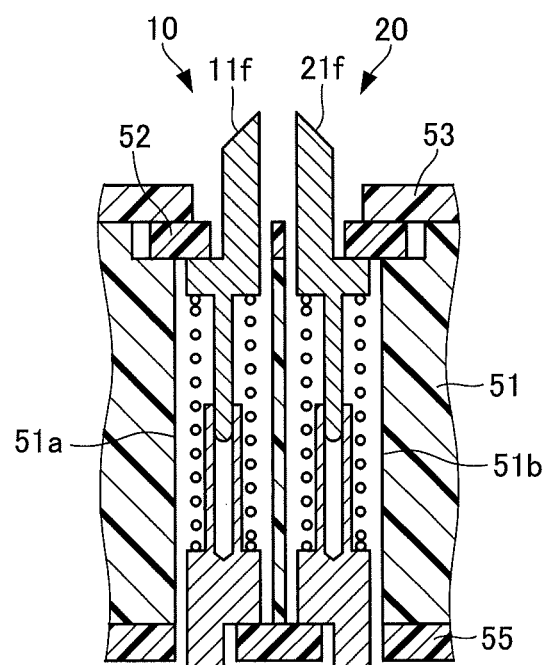

The housing body 51, which is constituted by an electrically insulating material, has a through bore 51*a* and a through bore 51*b* formed therein, the through bore 51*a* receiving the contact probe 10 and the through bore 51*b* receiving the contact probe 20 (FIG. 3B).

On the upper surface of the housing body 51 is arranged the electrode side retention body 52 constituted by an electrically insulating material. On the upper surface of the retention body 52 is provided the pressing plate 53 which is secured to the housing body 51 by the screw 56.

The electrode side retention body 52 has the through bore 52*a* and the through bore 52*b* formed therein, the through bore 52*a* and the through bore 52*b* respectively shaped in a semi circle as viewed from above (FIG. 3A). The through bore 52*a* and the through bore 52*b* respectively have a straight line portion forming a plane adapted to be held in a face to face relationship with respect to the rotation preventing surfaces 11*c* and 21*c*, respectively. By the construction as set forth above, the rotation preventing surfaces 11*c* and 21*c* can prevent the electrode side contact terminals 11 and 21 from being rotated around each of the center axes.

On the lower surface of the housing body 51 is arranged the land side retention body 55, which is secured to the housing body 51 by the screw 56.

Figure 3C:
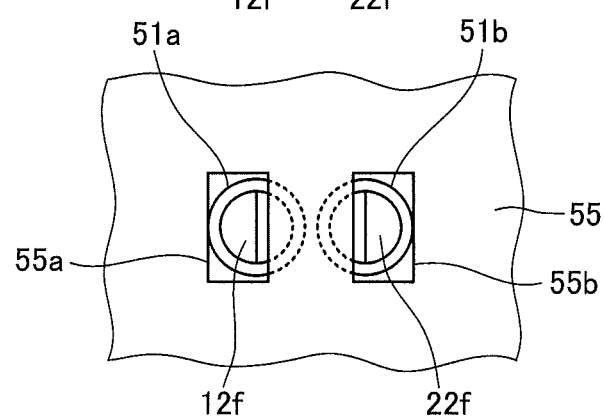

The land side retention body 55 has the through bore 55*a* and the through bore 55*b* formed therein, the through bore 55*a* and the through bore 55*b* respectively shaped in a rectangle as viewed from above (FIG. 3C). The through bore 55*a* and the through bore 55*b* respectively have a facing surface held in a face to face relationship with respect to the rotation preventing surfaces 12*c* and 22*c*, respectively. By the construction as set forth above, the rotation preventing surfaces 12*c* and 22*c* can prevent the electrode side contact terminals 12 and 22 from being rotated around each of the center axes.

Next, an assembly process of the Kelvin inspection fixture 100 will be briefly explained hereinafter. First, the land side retention body 55 is secured to the housing body 51 by the screw 56. Then, the contact probe 10 and 20 are inserted into the through bore 51*a* and the 51*b*, respectively. At this time, the land side contact terminals 12 and 22 are inserted into the through bore 55*a* and 55*b*, respectively, in such a manner that the land side inclined surface 12*f* of the contact probe 10 and the land side inclined surface 22*f* of the contact probe 20 are held in the face to face relationship with respect to each other.

Subsequently, a direction of each of the electrode side inclined surface 11*f* and 21*f* is adjusted in such a manner that the electrode side inclined surface 11*f* of the contact probe 10 and the electrode side inclined surface 21*f* of the contact probe 20 are held in the opposite relationship with respect to each other.

Thereafter, the electrode side retention body 52 and the pressing plate 53 are serially disposed on the housing body 51 and the pressing plate 53 is secured to the housing body 51 by the screw 54.

The contact probes 30 and 40 are assembled in a similar way as set forth above for the contact probes 10 and 20.

The foregoing description has been directed to a case in which the electrode of the IC 60 is constituted by the solder ball 61 and 62. However, the present invention is not limited to this case, and the present invention can be applied to a case in which the IC 60 has narrow pitch planar electrodes.

As can be understood from the foregoing description, the Kelvin inspection fixture 100 according to the present embodiment is constructed in such a manner that the electrode side inclined surface 11*f* and the electrode side inclined surface 21*f* are held in the opposite relationship with respect to each other, so that the electrode side inclined surface 11*f* and the electrode side inclined surface 21*f* can be securely brought into contact with the solder ball 61, even in such a case of narrow pitch that each of the solder balls 61 and 62 has a diameter of approximately 0.26 mm, with an interval of approximately 0.5 mm between the solder balls 61 and 62.

Further, the Kelvin inspection fixture 100 according to the present embodiment is constructed in such a manner that the electrode side inclined surface 11*f* and the electrode side inclined surface 21*f* are held in the opposite relationship with respect to each other, so that there is generated a moment of force operated in a direction to have the electrode side contact terminals 12 and 22 moved closer to each other in response to the IC 60 being mounted. As a result, the cylindrical rods 11*h* and 21*h* are securely brought into contact with the cylindrical hollow rod 12*h* of the land side contact terminal 21 and the cylindrical hollow rod 22*h* of the land side contact terminal 22, respectively.

Further, the Kelvin inspection fixture 100 according to the present embodiment is constructed in such a manner that the land side inclined surface 12*f* and the land side inclined surface 22*f* are held in the face to face relationship with respect to each other, so that there is no need to narrow pitches of the lands 71-74 of the circuit substrate 70 and the wiring connected to the lands 71-74.

Therefore, the Kelvin inspection fixture 100 according to the present embodiment can cope with narrow pitches of the electrode regardless of the shape of the electrode of the inspection object to be inspected, and, moreover, can avoid an increase in manufacturing cost of the circuit substrate 70.

Another Embodiment 1

The present invention can be applied to other embodiments than the aforementioned embodiment. For example, the Kelvin inspection fixture 100 according to the present invention can be constructed to have the aforementioned electrode side contact terminal 11 replaced by an electrode side contact terminal as shown in FIG. 4.

Figure 4:
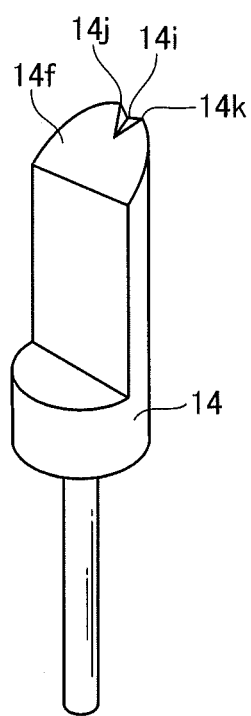
FIG. 4 is a perspective view similar to FIG. 1 but showing another embodiment 1 of the contact probe forming part of the first embodiment of the Kevin inspection fixture according to the present invention.

As shown in FIG. 4, the electrode side contact terminal 14 has a V shaped groove formed at an apex portion of an electrode side inclined surface 14*h*, so that the electrode side contact terminal 14 has two apices 14*j* and 14*k*. Hereinafter, the electrode side contact terminal applied to the contact probe 20 will be referred to as an electrode side contact terminal 24. The electrode contact terminals 14 and 24 are brought into contact with the solder ball 61 as shown in FIG. 5.

Figure 5A:
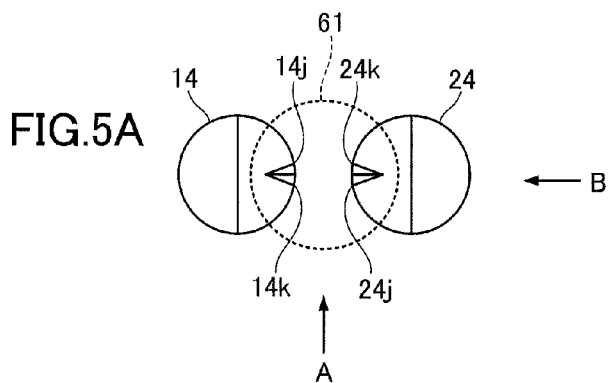
FIGS. 5A and 5B respectively show the construction of another embodiment 1 of the contact probe forming part of the first embodiment of the Kevin inspection fixture according to the present invention.
Figure 5B:
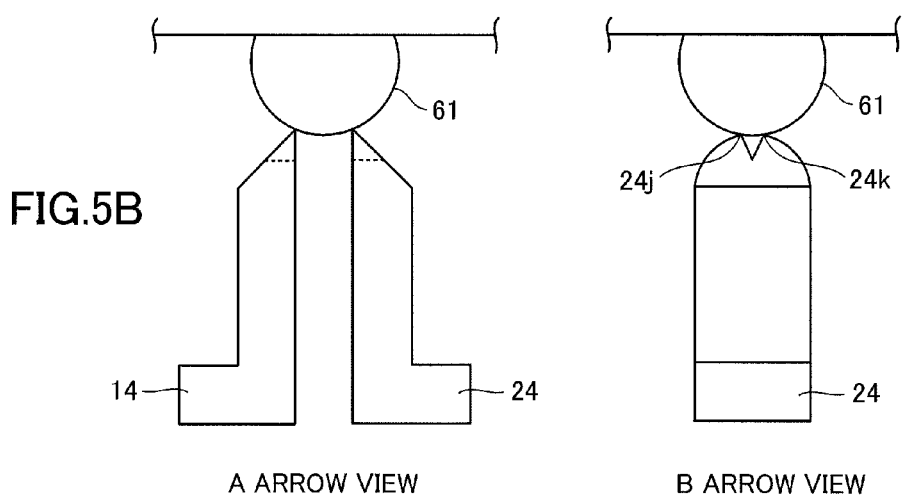

FIG. 5A shows a view of the electrode side contact terminals 14 and 24 as viewed from the solder ball 61 side, while FIG. 5B shows an A arrow view and a B arrow view as indicated by arrows in FIG. 5A. As shown in FIG. 5, four apices 14j, 14k, 24j and 24k are brought into contact with the solder ball 61 in this embodiment, thereby making it possible to obtain a more stable contact state. Here, each of the grooves formed at the apex portions of the electrode side contact terminals 14 and 24 is not limited to a V shape, and a plurality of grooves may be arranged so that three or more apices are formed.

Another Embodiment 2

Further, in the aforementioned embodiment, the Kelvin inspection fixture 100 is constructed in such a manner that the electrode side inclined surface 11f and the land side inclined surface 12f are parallel with respect to each other and the electrode side inclined surface 21f and the land side inclined surface 22f are parallel with respect to each other. However, the Kelvin inspection fixture according to the present invention can otherwise be constructed as shown in FIG. 6.

As shown in FIG. 6, contact probes 10A and 20A include a land side contact terminal 15 and 25, respectively. The land side contact terminal 15 has a land side inclined surface $15f_1$ and $15f_2$ formed thereon, while the land side contact terminal 25 has a land side inclined surface $25f_1$ and $25f_2$ formed thereon. The land side inclined surface $15f_1$ is not arranged in parallel with respect to the electrode side inclines surface 11f, while the land side inclined surface $25f_1$ is not arranged in parallel with respect to the electrode side inclines surface 21f.

Here, the structure of the land side inclined surfaces $15f_1$ and $15f_2$ can be applied to the electrode side contact terminal 11, and the structure of the land side inclined surfaces $25f_1$ and $25f_2$ can be applied to the electrode side contact terminal 21.

Another Embodiment 3

Figure 7A:
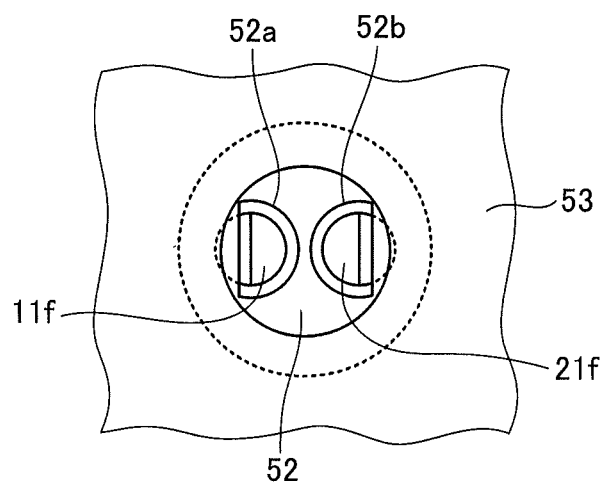
FIGS. 7A, 7B and 7C are construction views respectively similar to FIGS. 3A, 3B and 3C but showing the peripheral portion of another embodiment 3 of the contact probe forming part of the Kevin inspection fixture according to the present invention.
Figure 7B:
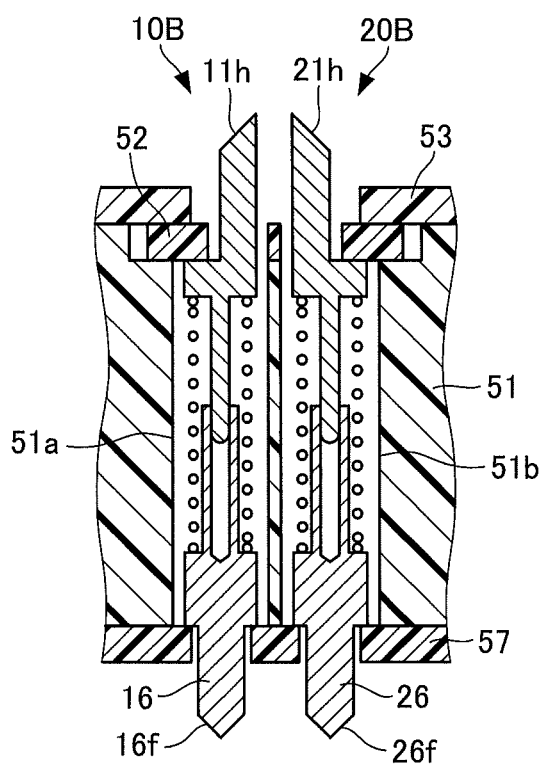
Figure 7C:
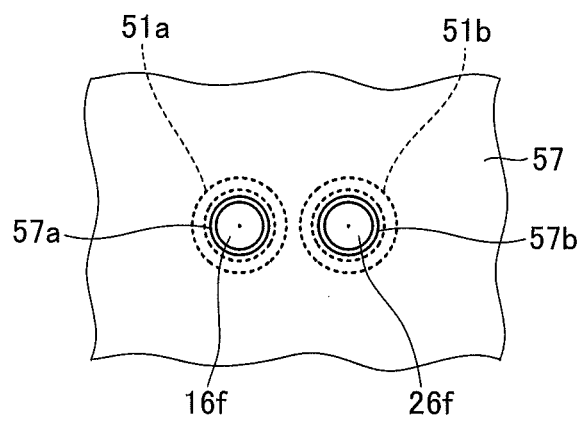

Further, the Kelvin inspection fixture 100 according to the present invention may be constructed as shown in FIG. 7. As shown in FIG. 7, each of contact probes 10B and 20B has a land side contact terminal 16 including a top end portion therein and a land side contact terminal 26 including a top end portion therein, respectively. The top end portion of the land side contact terminal 16 is protruding from a through bore 57b formed in the land side retention body 57 to have a cone shaped land side inclined surface 26f at a top end thereof. In this construction, there is not required a means to prevent a rotation of the land side contact terminals 16 and 26 around the center axes thereof.

Another Embodiment 4

Figure 8A:
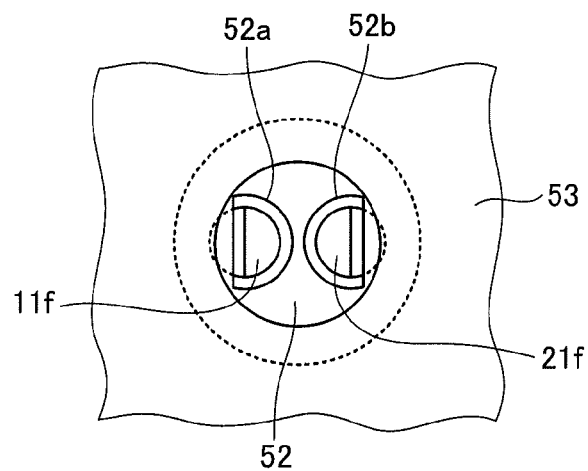
FIGS. 8A, 8B and 8C are construction views respectively similar to FIGS. 3A, 3B and 3C but showing the peripheral portion of another embodiment 4 of the contact probe forming part of the Kevin inspection fixture according to the present invention.
Figure 8B:
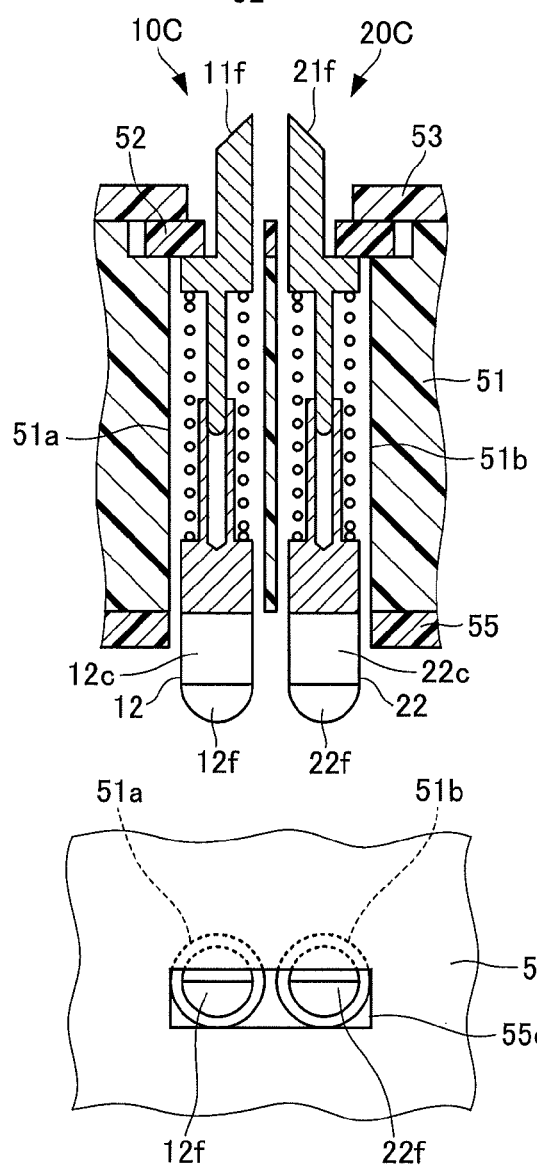

Furthermore, the Kelvin inspection fixture 100 according to the present invention may be constructed as shown in FIG. 8. As shown in FIG. 8, each of contact probes 10C and 20C has the same elements as those of the contact proves 10 and 20 as shown in FIG. 3, except that a direction of each of the land side inclined surface 12f and 22f shown in FIG. 8 is different from a direction of the land side inclined surface 12f and 22f shown in FIG. 3.

Figure 8C:
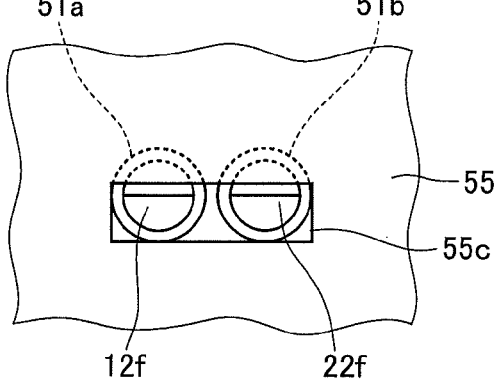

To be more specific, as shown in FIG. 8C, the land side contact terminal 12 of the contact probe 10C is the land side terminal 12 as shown in FIG. 3 rotated 90 degrees in a clockwise direction as viewed from below. However, the rotation angle of the land side contact terminals 12 and 22 is not restricted to 90 degrees.

The land side retention body 55 has a rectangular through bore 55c formed therein as viewed from below. The through bore 55c includes a facing surface held in an opposite relationship with respect to the rotation preventing surfaces 12c and 22c. By the construction as set forth above, the rotation preventing surfaces 12c and 22c can prevent the land side contact terminals 12 and 22 from being rotated around each of the center axes.

Second Embodiment

Figure 9A:
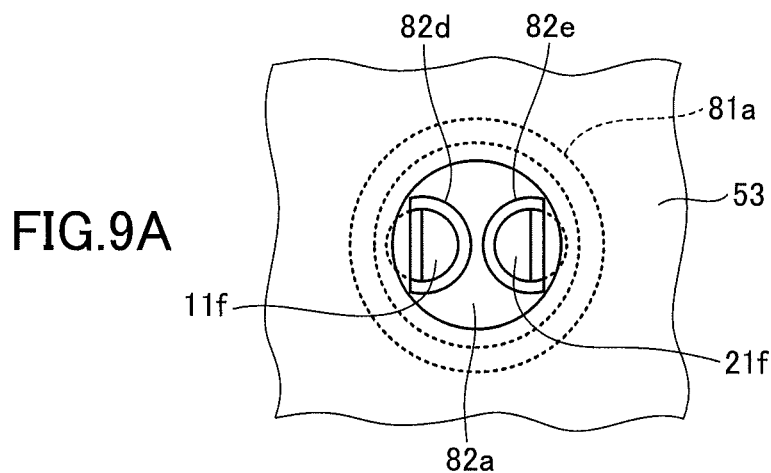
FIGS. 9A, 9B and 9C are construction views respectively similar to FIGS. 3A, 3B and 3C but showing the peripheral portion of a second embodiment of the Kevin inspection fixture according to the present invention.
Figure 9B:
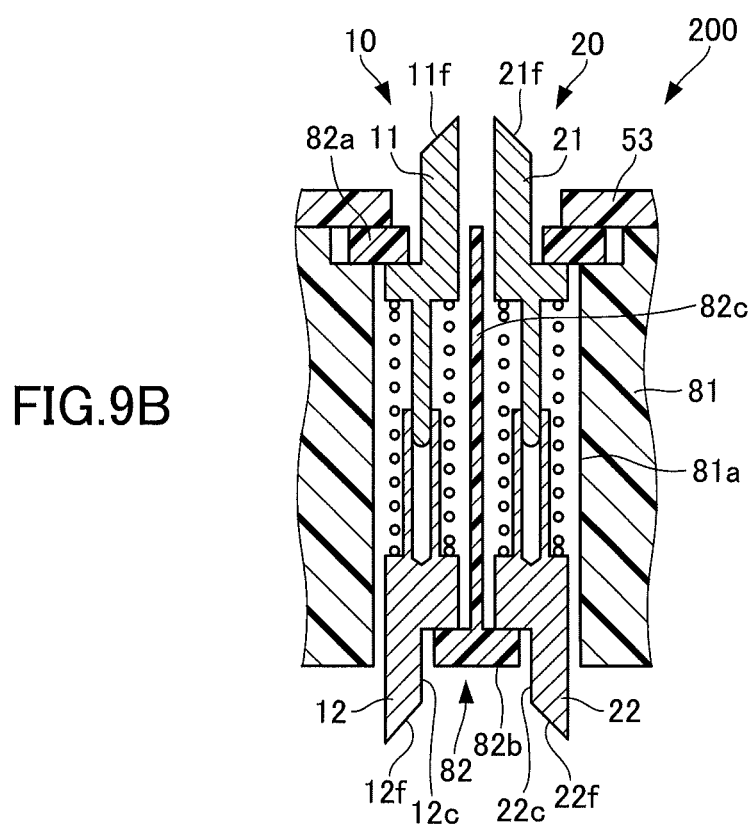

FIG. 9 is a view showing a Kelvin inspection fixture 200 according to the second embodiment of the present invention.

The Kelvin inspection fixture 200 has a housing body 81 and a retention body 82 provided therein.

The housing body 81 has a through bore 81a provided therein, and is adapted to retain the contact probes 10 and 20 through the through bore 81a.

The retention body 82 is integrally formed with an electrically insulating material. The retention body 82 has an electrode side retention body 82a, a land side retention body 82b and a connection portion 82c adapted to connect the electrode side retention body 82a and the land side retention body 82b.

Figure 9C:
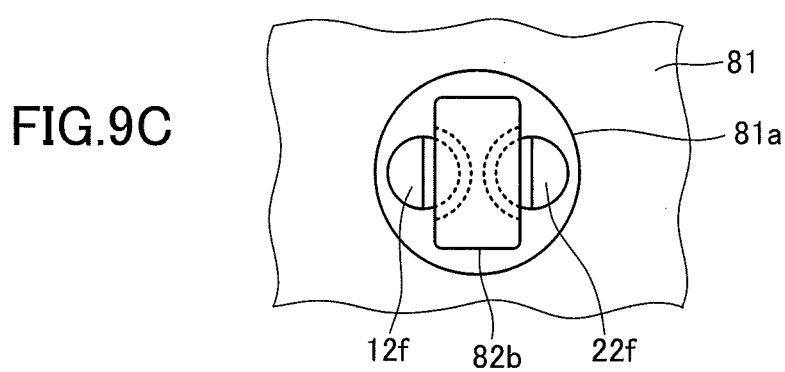

The electrode side retention body 82a has semi circular through bores 82d and 82e arranged therein as viewed from above (FIG. 9A). By the construction as set forth above, the rotation preventing surfaces 11c and 21c can prevent the electrode side contact terminals 11 and 21 from being rotated around each of the center axes. Further, the land side retention body 82b is rectangular in shape as viewed from below. By the construction as set forth above, the rotation preventing surfaces 11c and 21c can prevent the electrode side contact terminals 11 and 21 from being rotated around each of the center axes (FIG. 9C).

Next, an assembly process of the Kelvin inspection fixture 200 will be briefly explained hereinafter. First, the contact probes 10 and 20 are incorporated into the retention body 82. Specifically, the electrode side contact terminal 11 of the contact probe 10 is inserted into the through bore 82d, and the land side surface 12b of the land side contact terminal 12 is placed on an upper surface of the land side retention body 82 while compressing the spring 13. The contact probe 20 is incorporated into the retention body 82 in a similar way. As a result, the electrode side inclined surface 11f and the electrode side inclined surface 21f are held in the opposite relationship with respect to each other, while the land side inclined surface 12f and the land side inclined surface 21f are held in the face to face relationship with respect to each other. Hereinafter, the retention body 82 with the contact probes 10 and 20 incorporated therein will be referred to as a "contact probe assembly".

Subsequently, the contact probe assembly is inserted into the through bore 81a from an upper surface side of the housing body 81. Then, the pressing plate 53 is laid on an upper surface of the housing body 81 to be secured to the housing body 81 with the screw 54.

As can be understood from the foregoing description, the Kelvin inspection fixture 200 according to the present embodiment is constructed to incorporate a preliminarily assembled contact probe assembly into the housing body 81, thereby making it easy to assemble the Kelvin inspection fixture 200.

Third Embodiment

Figure 10A:
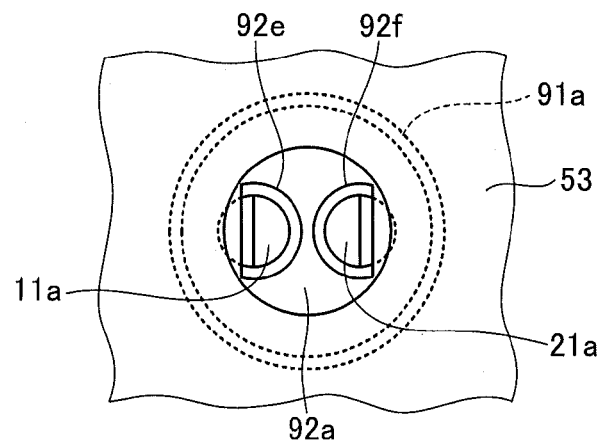
FIGS. 10A, 10B and 10C are construction views respectively similar to FIGS. 3A, 3B and 3C but showing the peripheral portion of a third embodiment of the Kevin inspection fixture according to the present invention.
Figure 10B:
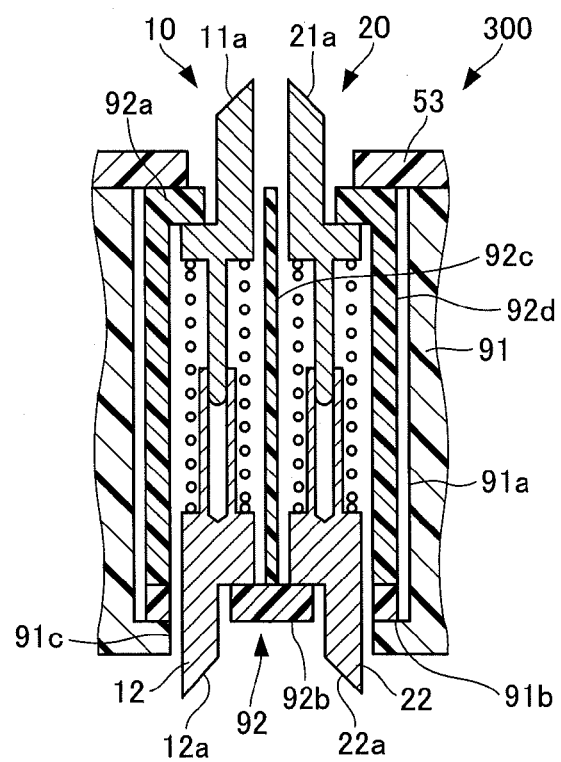

FIG. 10 is a view showing a Kelvin inspection fixture 300 according to the third embodiment of the present invention.

The Kelvin inspection fixture 300 has a housing body 91 and a retention body 92 provided therein.

The housing body 91 has a through bore 91a, a receiving surface 91b and a through bore 91c formed therein, the through bore 91a retaining the contact probes 10 and 20, the receiving surface 91b receiving a land side retention body 92 described hereinafter and the through bore 91c allowing the land side contact terminals 12 and 22 to penetrate therethrough.

The retention body 92 is constituted by an electrically insulating material. The retention body 92 is constructed in, a double structure consisting of an integrated structure and another structure, the integrated structure inclusive of an electrode side retention body 92a, a connection portion 92c and a cover member 92d, the another structure inclusive of a land side retention body 92b. The cover member 92d covers an outer peripheral of the contact probes 10 and 20.

The electrode side retention body 92a has a semi circle shaped through bores 92e and 92f arranged therein as viewed from above (FIG. 10A). The through bores 92e and 92f have a facing surface held in a face to face relationship with respect to the rotation preventing surfaces 11c and 21c, respectively. By the construction as set forth above, the rotation preventing surfaces 11c and 21c can prevent the electrode side contact terminals 11 and 21 from being rotated around each of the center axes.

Figure 10C:
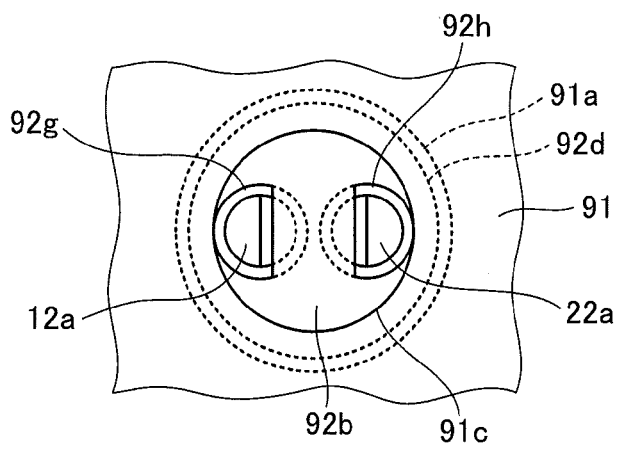

The land side retention body 92b has a rectangular through bores 92g and 92h arranged therein as viewed from below (FIG. 10C). The through bores 92g and 92h have a facing surface held in a face to face relationship with respect to the rotation preventing surfaces 12c and 22c, respectively. By the construction as set forth above, the rotation preventing surfaces 12c and 22c can prevent the land side contact terminals 12 and 22 from being rotated around each of the center axes.

Next, an assembly process of the Kelvin inspection fixture 300 will be briefly explained hereinafter. First, the contact probes 10 and 20 are incorporated into the retention body 92. Specifically, the electrode side contact terminal 11 of the contact probe 10 is inserted into the through bore 92e, and the land side contact terminal 21 of the contact probe 20 is inserted into the through bore 92f. As a result, the electrode side inclined surface 11f and the electrode side inclined surface 21f are held in the opposite relationship with respect to each other.

Subsequently, a direction of each of the land side inclined surface 12f and 22f is adjusted in such a manner that the land side inclined surface 12f of the contact probe 10 and the land side inclined surface 22f of the contact probe 20 are held in the face to face relationship with respect to each other.

Further, the land side retention body 92b is attached to the connection portion 92c and the cover member 92d to be finally bonded by for example a bonding material, while compressing the springs 13 and 23. The contact probe assembly thus bonded is inserted into the through bore 91a from an upper surface side of the housing body 91.

Then, the pressing plate 53 is laid on the upper surface of the housing body 91 to be secured to the housing body 91 with the screw 54.

As can be understood from the foregoing description, the Kelvin inspection fixture 300 according to the present embodiment is constructed to incorporate a preliminarily assembled contact probe assembly into the housing body 91, thereby making it easy to assemble the Kelvin inspection fixture 300.

INDUSTRIAL APPLICABILITY

The Kelvin contact probe and the Kelvin inspection fixture according to the present invention can cope with narrow pitches of the electrode regardless of the shape of electrode of the inspection object to be inspected, and, moreover, can avoid an increase in manufacturing cost of the circuit substrate, so that the Kelvin contact probe structure and the Kelvin inspection fixture according to the present invention is useful as the Kelvin contact probe structure and the Kelvin inspection fixture to be used in inspection of the resistance value between the electrodes of the semiconductor integrated circuits.

EXPLANATION OF REFERENCE NUMERALS 10, 20, 30 contact probe
10A, 10B, 10C, 20A, 20B, 20C contact probe
11, 14, 21, 24 electrode side contact terminal
11f, 14f, 21f, 24f electrode side inclined surface
11c, 12c, 21c, 22c rotation preventing surface
11h, 21h cylindrical rod
12, 15, 16, 22, 25, 26 land side contact terminal
12f, 15$f_1$, 15$f_2$, 16f, 22f, 25$f_1$, 25$f_2$, 26f land side inclined surface
12h, 22h cylindrical hollows rod
14i V shaped groove
14j, 14k apex
51, 81, 91 housing body
51a, 51b, 81a, 91a through bore
52, 82a, 92a electrode side retention body
52a, 52b, 82d, 82e, 92e, 92f through bore
53 pressing plate
54, 56 screw
55, 57, 82b, 92b land side retention body
55a, 55b, 55c, 57a, 57b, 91c, 92g, 92h through bore
60 IC
61, 62 solder ball
70 circuit substrate
71, 72, 73, 74 land
82, 92 retention body
82c, 92c connection portion
91b receiving surface
92d cover member
100, 200, 300 Kelvin inspection fixture

The invention claimed is:

1. A Kelvin contact probe structure, comprising: two contact probes including one contact probe and the other contact probe, and axially arranged in parallel with each other to have one electrode electrically connected with two lands, and the electrode being provided on an inspection object to be inspected, and the two lands being provided on a circuit substrate, in which each of the one contact probe and the other contact probe has an electrode side contact terminal and a land side contact terminal provided therein, the electrode side contact terminal arranged in an electrode side to be contactable with the electrode, the land side contact terminal being arranged in a land side to be contactable with the land, each of the one contact probe and the other contact probe includes the electrode side contact terminal contactable with the electrode, the land side contact terminal contactable with the land and a metal spring arranged between the electrode side contact terminal and the land side contact terminal, the electrode side contact terminal includes a disk shaped electrode side contact terminal flange portion, an electrode side contact terminal rotation preventing portion, an electrode side inclined surface portion and a cylindrical rod, the disk shaped electrode side contact terminal flange portion having an electrode side surface and a land side surface, the electrode side contact terminal rotation preventing portion stretching from the electrode side surface of the electrode side contact terminal flange portion to be defined by a plate shaped electrode side contact terminal rotation preventing surface and a semi arc shaped electrode side contact terminal semi arc surface, the electrode side inclined surface portion defined by a surface inclined from center of a top end of the electrode side contact terminal semi arc surface toward the electrode side contact terminal flange portion, the cylindrical rod stretching from center of the land side surface of the electrode side contact terminal flange portion and being smaller in diameter than the electrode side contact terminal flange portion, the land side contact terminal includes a disk shaped land side contact terminal flange portion, a land side contact terminal rotation preventing portion, a land side inclined surface portion and a cylindrical hollow rod, the disk shaped land side contact terminal flange portion having a land side surface and an electrode side surface, the land side contact terminal rotation preventing portion stretching from the land side surface of the land side contact terminal flange portion to be defined by a plate shaped land side contact terminal rotation preventing surface and a semi arc shaped land side contact terminal semi arc surface, the land side inclined surface portion defined by a surface inclined from center of a top end of the land side contact terminal semi arc surface toward the land side contact terminal flange portion, the cylindrical hollow rod stretching from center of the electrode side surface of the land side contact terminal flange portion and being smaller in diameter than the land side contact terminal flange portion to receive the cylindrical rod, the metal spring being arranged between the land side surface of the electrode side contact terminal flange portion and the electrode side surface of the land side contact terminal flange portion, and the one contact probe and the other contact probe being arranged in such a manner that the electrode side inclined surfaces faces are held in an opposite relationship with respect to each other and that the land side inclined surfaces are held in a face to face relationship with respect to each other.

2. The Kelvin contact probe structure as set forth in claim 1, in which each of the electrode side contact terminals has a plurality of apices formed by at least one groove arranged at a top portion of the electrode side inclined surface.

3. A Kelvin inspection fixture comprising the Kelvin contact probe structure as set forth in claim 1, which further comprises:

a housing body provided therein with a through bore and adapted to retain the one contact probe and the other contact probe through the through bore;

an electrode side retention body that retains the electrode side contact terminal; and a land side retention body that retains the land side contact terminal.

4. The Kelvin inspection fixture as set forth in claim 3, which further comprises a connection portion arranged between the one contact probe and the other contact probe, the connection portion connecting the electrode side holder and the land side holder.

5. The Kelvin inspection fixture as set forth in claim 4, in which each of the one contact probe and the other contact probe has an outer periphery, and which further comprises a cover member that covers the outer periphery of the one contact probe and the other contact probe.

\* \* \* \* \*